(12) United States Patent
Chang et al.

(10) Patent No.: US 9,347,149 B2
(45) Date of Patent: May 24, 2016

(54) METHOD FOR GROWING EPITAXIAL DIAMOND

(71) Applicant: National Chiao Tung University, Hsinchu (TW)

(72) Inventors: Li Chang, HSinchu (TW); Ping-Hsun Wu, Hsinchu (TW); Kun-An Chiu, Hsinchu (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 385 days.

(21) Appl. No.: 13/940,792

(22) Filed: Jul. 12, 2013

(65) Prior Publication Data

US 2014/0137795 A1    May 22, 2014

(30) Foreign Application Priority Data

Nov. 20, 2012  (TW) .............. 101143227 A

(51) Int. Cl.
*C30B 29/04* (2006.01)
*C30B 25/18* (2006.01)

(52) U.S. Cl.
CPC ............... *C30B 25/183* (2013.01); *C30B 29/04* (2013.01)

(58) Field of Classification Search
CPC .......... C30B 29/04; C30B 25/18; C30B 25/02
See application file for complete search history.

(56) References Cited

U.S. PATENT DOCUMENTS

| | | | | |
|---|---|---|---|---|
| 9,076,653 | B2* | 7/2015 | Noguchi | ............ C30B 25/186 |
| 2004/0069209 | A1* | 4/2004 | Golding | ............ C30B 25/105 117/2 |
| 2005/0181131 | A1* | 8/2005 | Linares | ............ C30B 25/02 427/249.8 |
| 2009/0176114 | A1* | 7/2009 | Sawabe | ............ C23C 16/272 428/471 |

FOREIGN PATENT DOCUMENTS

JP    09309794    * 12/1997

* cited by examiner

*Primary Examiner* — Robert M Kunemund
(74) *Attorney, Agent, or Firm* — Muncy, Geissler, Olds & Lowe PC

(57) ABSTRACT

A method for growing epitaxial diamond is provided here. A metallic layer is deposited on a diamond substrate and is followed by an epitaxial diamond film deposited on top of the metallic layer. As a buffer layer, the metallic layer relieves stress accumulated in the thin film of the epitaxial diamond to prevent cracks. In consequence, diamond epitaxial layers with desired thickness and good quality can be obtained.

25 Claims, 3 Drawing Sheets

METHOD FOR GROWING EPITAXIAL DIAMOND

BACKGROUND OF THE INVENTION

1. Field of the Invention

The present invention relates to a method for growing epitaxial diamond and more particularly to a method for growing epitaxial diamond on a diamond substrate after depositing a metallic layer on the diamond substrate.

2. Description of the Prior Art

Diamond possesses several unique physical and chemical properties and is considered an excellent material to apply to different technical fields. About its mechanical properties, it has extremely high hardness (Vickers hardness, Hv=50-104 GPa), low coefficient of air friction (~0.035 to 0.15), wear-resistance, high strength ($1.2 \times 10^{12}$ $Nm^{-2}$) and stiffness. As for thermal properties, diamond has superior thermal conductivity of 20 $Wcm^{-1}K^{-1}$. Regarding photoelectric properties, diamond has wide band gap (Eg=5.45 eV), high dielectric coefficients ($10^6$ V/cm), significant electron mobility ($m_e$=4500 $cm^2V^{-1}s^{-1}$) and hole mobility ($m_p$=3800 $cm^2V^{-1}s^{-1}$) better than silicon, ultra high refractive index and transparency. With respect to other properties, diamond has excellent chemical stability, radiation resistance and biocompatibility. As a material which possesses desired physical and chemical properties, diamond has great potential in industry. Single crystal diamond is considered a promising material and has been researched and developed in recent years. In order to be widely used in industry, high growth rate and diamonds of larger size are desired.

The most popular method to grow diamond film is to use chemical vapor deposition (CVD). It has the characteristic of low process temperature and pressure, and enables a high growth rate of diamond film with superior purity; especially for manufacturing single crystal diamond with large area and smooth surface. Hydrogen and methane are usually supplied during the growth process. Generally, hot filament chemical vapor deposition (HFCVD) and microwave plasma chemical vapor deposition (MPCVD) are adopted. For HFCVD, a filament set above the substrate arranged inside the quartz tube is heated to 2000° C. to 2200° C. so that the carbon containing gases are dissociated to generate carbon radicals for growing diamond films. Hydrogen acts as protective gas to prevent formation of graphite. As for, MPCVD, microwave passes through the reaction chamber to dissociate low pressure gases filling inside to generate plasma. Plasma is composed of dissociated particles at high temperature such as free electrons, charged ions and neutral particles to bombard and heat substrates and thereby overcoming activation energy of chemical reactions which originally have high energy barriers. Also, it allows carbon containing gases to be dissociated at relatively lower temperature to generate carbon radicals and contributes to diamond deposition. Besides, ionized hydrogen gives higher etching rate of graphite than that of diamond. It is helpful to improve diamond quality.

Although it has been reported for years that growing high quality epitaxial diamond films is practicable, problems still remain to be solved. One main issue is that internal stress and defects formed inside diamond films during the deposition process leads to cracks. For example, intrinsic defects of substrates or impurities such as hydrogen atoms, nitrogen atoms, carbon atoms and graphite accumulated inside the diamond films form stress field. As a result, deformation and cracks occur to release stress. This phenomenon is frequently found when growing (111) epitaxial diamond and thus restricts uses of (111) diamond for electronic devices. From another point of view, growing thin films on substrates is usually accompanied with tiny deformation. In the beginning, tiny deformation can be ignored. However, if the diamond film reaches a certain thickness and diamond structure cannot be compatible with excessive deformation, stress will be released in the form of cracks.

Hence, it is necessary to develop a method to grow diamond epitaxial film with desired thickness and prevent cracks due to excessive stress.

SUMMARY OF THE INVENTION

The present invention is directed to a method for growing epitaxial diamond films. A metallic layer is deposited on a diamond substrate and then followed by an epitaxial diamond film is deposited on top of the metallic layer. As a buffer layer, the metallic layer relieves stress accumulated in the thin film of the epitaxial diamond to prevent cracks. In consequence, diamond epitaxial layers with desired thickness and good quality can be obtained.

According to one embodiment of the present invention, a method for growing epitaxial diamond comprises: providing a diamond substrate with an upper surface; depositing at least a metallic layer on the diamond substrate, wherein the metallic layer is a non-continuous film to expose portion of the upper surface; providing a reaction atmosphere; and depositing an epitaxial diamond layer on the exposed upper surface of the diamond substrate and then the epitaxial diamond layer laterally growing to form a continuous film to cover the metallic layer. The metal composition of the metallic layer has at least one of the following features. One is that the lattice mismatch between the metal composition and diamond is less than 15%. The other is that the dissolution rate of carbon in the metal composition is less than 2 wt %.

According to another embodiment of the present invention, a method for growing epitaxial diamond comprises: providing a diamond substrate, depositing at least a metallic layer on the diamond substrate, annealing to crack the metallic layer into a non-continuous film, providing a reaction atmosphere and depositing an epitaxial diamond layer on the diamond substrate and the metallic layer. The metal composition of the metallic layer has at least one of the following features. One is that the lattice mismatch between the metal composition and diamond is less than 15%. The other is that the dissolution rate of carbon in the metal composition is less than 2 wt %.

The objective, technologies, features and advantages of the present invention will become apparent from the following description in conjunction with the accompanying drawings wherein certain embodiments of the present invention are set forth by way of illustration and example.

BRIEF DESCRIPTION OF THE DRAWINGS

The foregoing conceptions and their accompanying advantages of this invention will become more readily appreciated after being better understood by referring to the following detailed description, in conjunction with the accompanying drawings, wherein.

DESCRIPTION OF THE PREFERRED EMBODIMENT

The detailed explanation of the present invention is described as follows. The described preferred embodiments are presented for purposes of illustrations and description, and they are not intended to limit the scope of the present invention.

Figure 1A:
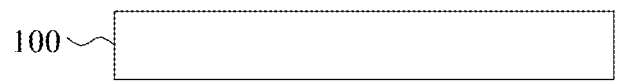
FIGS. 1a, 1b, 1c, 1d, and 1e are flowcharts displaying steps of the method of growing epitaxial diamond films according to one embodiment of the present invention.
Figure 1B:
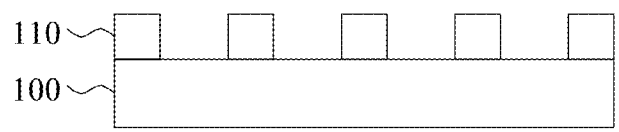
Figure 1C:
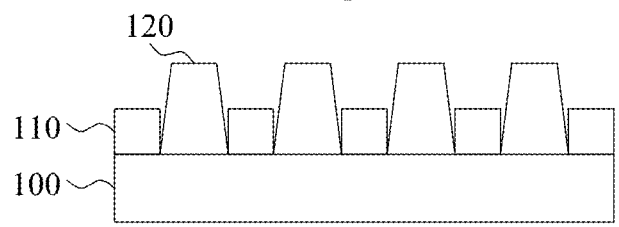
Figure 1D:
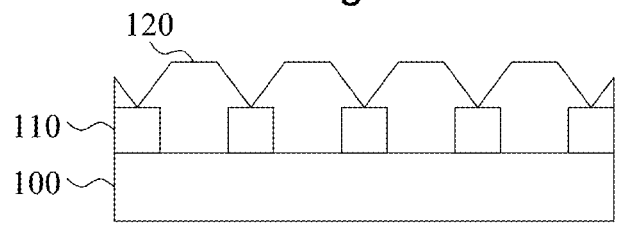
Figure 1E:
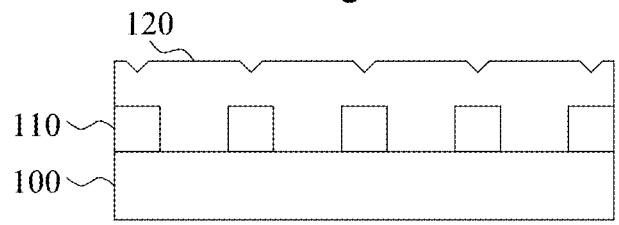
Figure 2A:
FIGS. 2a, 2b, 2c, 2d, 2e, and 2f are flowcharts displaying steps of the method of growing epitaxial diamond films according to another embodiment of the present invention.
Figure 2B:
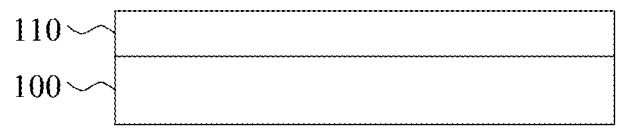
Figure 2C:
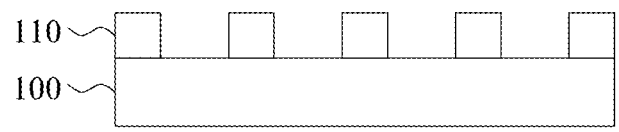
Figure 2D:
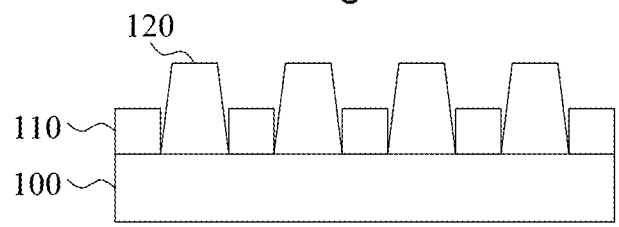
Figure 2E:
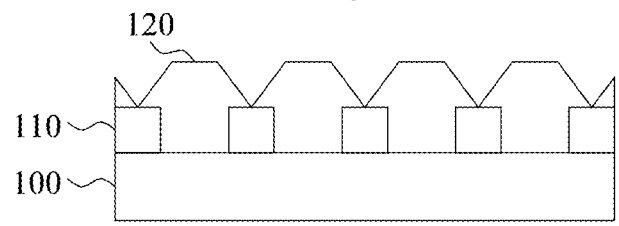
Figure 2F:
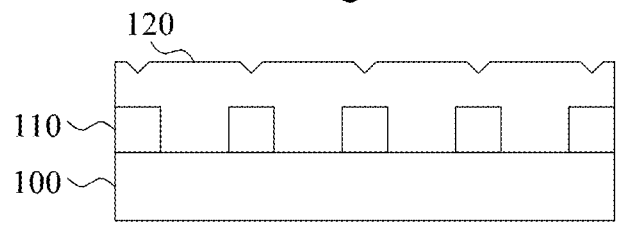

Referring to FIG. 1a to 1e, FIG. 1a to FIG. 1e are flowcharts displaying steps of the method growing epitaxial diamond films according one embodiment of the present invention. The method comprises a plurality of steps as follows: providing a diamond substrate 100 with an upper surface (FIG. 1a), depositing at least a metallic layer 110 on the diamond substrate, wherein the metallic layer is a non-continuous film to expose portion of the upper surface (FIG. 1b). Providing a reaction atmosphere and depositing an epitaxial diamond layer 120 on the exposed upper surface of the diamond substrate 100 (FIG. 1c). Then, as shown in FIG. 1d, the epitaxial diamond layer laterally grows to form a continuous film to cover the metallic layer 110 as shown in FIG. 1e. The metal composition of the metallic layer has at least one of the following features. One is that the lattice mismatch between the metal composition and diamond is less than 15%. The other is that the dissolution rate of carbon in the metal composition is less than 2 wt %.

In one embodiment, the diamond substrate 100 can be a single crystal diamond, a polycrystalline diamond, a homoepitaxial diamond film or a hetepitaxial diamond film.

The method for depositing a diamond epitaxial layer is using microwave plasma chemical vapor deposition, hot filament chemical vapor deposition, plasma enhanced chemical vapor deposition, low-pressure chemical vapor deposition or DC plasma chemical vapor deposition. The reaction atmosphere is provided during deposition process. Gas species of the reaction atmosphere is selected from hydrogen, argon, carbon oxide, carbon dioxide, alkanes, alkenes, and alkynes. For example, hydrogen and methane can be mixed and provided at the same time.

With respect to the metal composition of the metallic layer 110, there are two factors to be considered. One is lattice mismatch and the other one is dissolution rate of carbon. Lattice mismatch means the difference of lattice constant between the substrate and the epitaxial layer deposited thereon. Diamond epitaxial layer 120 mostly grows on the metallic layer 110 and significant difference of lattice mismatch may result in defects such as dislocation to release excessive stress, which affects the quality of the diamond epitaxial layer. For this reason, the metal composition of the metallic layer 110 which has the feature that lattice mismatch between the metal composition and diamond being less than 15% is ideal here. Preferably, lattice mismatch is less than 14%. Apart from this, dissolution rate of carbon in the metallic layer 110 also affects epitaxy quality. If it is too easy for carbon atoms dissolving into metal to become solid solution with high dissolution rate, it is not conducive to the combination between carbon atoms so that it obstructs diamond growth. Besides, carbon atoms in the solid solution build a stress field to press the lattice of epitaxial diamond and cause defects. To prevent aforementioned problems, the metal composition of the metallic layer 110 which has the feature that dissolution rate of carbon in the metal composition is less than 2 wt % can also be selected here. Preferably, dissolution rate of carbon is less than 1.2 wt %. Correspondingly, the metal composition of the metallic layer 110 is selected from gold, silver, copper, platinum, iridium, nickel, cobalt, and palladium. The metallic layer 110 can be a single layer structure or a multiple-layered structure and is composed of single metal or alloy.

Referring to FIG. 1a to FIG. 1e, these flowcharts display steps of the method growing epitaxial diamond films according to one embodiment of the present invention. In FIG. 1a, using the diamond substrate 100 benefits growing homoepitaxial diamond because there is no lattice mismatch between the epitaxial diamond layer 120 and the diamond substrate 100. In FIG. 1b, a metallic layer 110 is deposited on the diamond substrate 100. The metallic layer 110 is a non-continuous film. For example, the non-continuous film can be plate-like, spherical or island-like agglomerates. The methods of depositing the metallic layer 110 on the diamond substrate 100 are using evaporation deposition, sputtering, molecular beam epitaxy (MBE) growth, atmospheric pressure chemical vapor deposition, low-pressure chemical vapor deposition, plasma enhanced chemical vapor deposition, spin coating method or chemical synthesis method. In one embodiment, thickness of the metallic layer 110 is less than 1 micrometer. In FIG. 1c, the epitaxial diamond layer 120 starts to grow on the exposed upper surface of the diamond substrate 100. In this embodiment, the epitaxial diamond layer 120 is formed as island initially and then laterally grows to form a continuous film. In FIG. 1d, after filling space within the metallic layer 110, the epitaxial diamond layer 120 turns to grow laterally and gradually contact each other. As a result, the epitaxial diamond layer 120 is formed as a continuous film. The epitaxial diamond layer 120 can be (100) or (111) epitaxy. In one embodiment, there is an carbide layer (not shown in the figures) arranged between the epitaxial diamond layer 120 and the metallic layer 110, acting as a buffer layer to reduce lattice mismatch such that the metallic layer 110 is more easily deposited on the epitaxial diamond layer 120.

Referring to FIG. 2a to FIG. 2f, these flowcharts display steps of the method growing epitaxial diamond films according to another embodiment of the present invention. Major steps and theory are described before and will not be elaborated hereafter. The difference between these embodiments relates to the way for generating a non-continuous film. According to this embodiment, a metallic layer 110 which is a continuous film (wholly continuous or partly continuous) is deposited on the diamond substrate 100. Then, an annealing process with high temperature is proceeded to crack the metallic layer 110 to become non-continuous. The process temperature must be high enough to melt the metallic layer 110. For instance, it must be higher than the melting point of the metallic layer 110 or near the eutectic temperature of the metallic layer 110 and carbon. The annealing process comprises plasma annealing, protective atmosphere annealing or vacuum annealing. The atmosphere of the plasma annealing is selected from hydrogen, argon, carbon oxide, carbon dioxide, alkanes, alkenes, and alkynes. The gas species of the protective atmosphere is selected from inert gases, hydrogen and nitrogen.

From another point of view, the metallic layer 110 can release structural stress. When the epitaxial diamond layer 120 grows laterally to contact each other, it causes tensile stress. If the tensile stress is accumulated to exceed the limit, it leads to defects and even cracks. In contrast, the metallic layer 110 has smaller lattice constant. While the metallic layer 110 combines with diamond lattice, it has compressive stress so as to counteract the tensile stress caused by the epitaxial diamond layer 120 and thus prevents cracks.

Preferred embodiments described hereinafter are presented for purposes of illustrations and description, and they are not intended to limit the scope of the present invention.

The Embodiment I

Figure 3A:
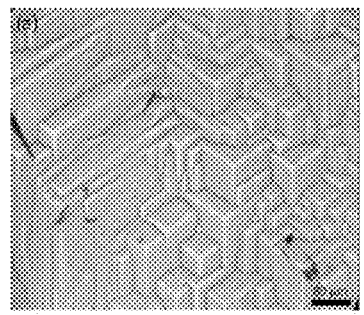
FIG. 3a is an optical image of surface morphology of the (111) epitaxial diamond layer according to the embodiment I of the present invention.
Figure 3B:
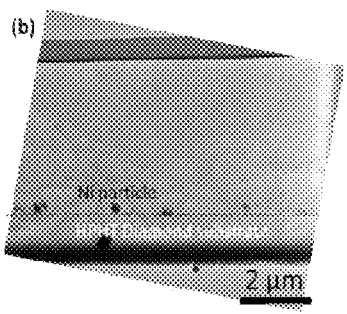
FIG. 3b is a cross-sectional TEM (transmission electron microscope) image of the (111) epitaxial diamond layer according to the embodiment I of the present invention.

A (111) single crystal diamond manufactured by HPHT (high pressure and high temperature) process is adopted as a diamond substrate and is followed by a nickel layer with thickness of 20 nm deposited on the diamond substrate via electron beam evaporation method. Lattice mismatch between nickel and diamond is 1.4%; dissolution rate of carbon in nickel is 0.9 wt % (>1000° C.). There is no C—Ni reactant according to the C—Ni phase diagram. Subsequently, the substrate is placed into a microwave plasma chemical deposition system for annealing processes at high temperature. The process parameters are: microwave power 800 W, pressure 80 torr, pure hydrogen, deposition time 10 min, substrate temperature 850° C.-1100° C. After the annealing process, a (111) epitaxial diamond film is deposited on the metallic layer and the diamond substrate. Growth parameters of the epitaxial diamond film are that: microwave power 800 W, pressure 80 torr, ratio of hydrogen and methane is 99.5:0.5 (volume ratio). Finally, a (111) epitaxial diamond film free of cracks with thickness of 5 μm is obtained, as displayed in FIG. 3a and FIG. 3b.

The Embodiment II

Figure 3C:
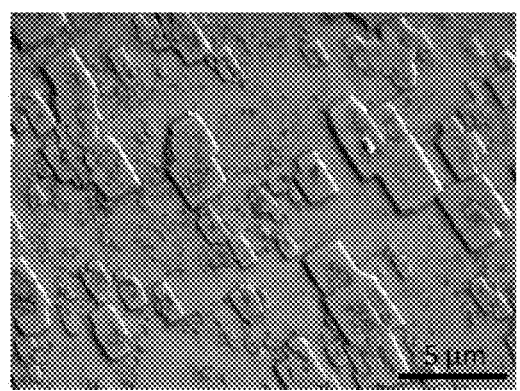
FIG. 3c is a SEM (scanning electron microscope) image of the (100) epitaxial diamond layer according to the embodiment II of the present invention.

A (100) single crystal diamond manufactured by HPHT (high pressure and high temperature) process is adopted as a diamond substrate and is followed by a nickel layer with thickness of 20 nm deposited on the diamond substrate via electron beam evaporation method. Lattice mismatch between nickel and diamond is 1.4%; dissolution rate of carbon in nickel is 0.9 wt % (>1000° C.). There is no C—Ni reactant according to the C—Ni phase diagram. Subsequently, the substrate is placed into a microwave plasma chemical deposition system for an annealing process at high temperature. The process parameters are: microwave power 800 W, pressure 80 torr, pure hydrogen, deposition time 10 min, substrate temperature 850° C.-1100° C. After the annealing process, a (100) epitaxial diamond film is deposited on the metallic layer and the diamond substrate. Growth parameters of the epitaxial diamond film are as follow: microwave power 800 W, pressure 80 torr, ratio of hydrogen and methane is 99.5:0.5 (volume ratio). Finally, a (100) epitaxial diamond film free of cracks with thickness of 5 μm is obtained, as displayed in FIG. 3c.

In conclusion, the present invention proposes a method for growing epitaxial diamond films. A metallic layer is deposited on a diamond substrate and is followed by an epitaxial diamond film deposited on top of the metallic layer. As a buffer layer, the metallic layer relieves stress accumulated in the thin film of the epitaxial diamond to prevent cracks. In consequence, diamond epitaxial layers with desired thickness and good quality can be obtained, as described in the embodiment I and II.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. A method for growing epitaxial diamond comprising:
providing a diamond substrate with an upper surface;
depositing at least a metallic layer on the diamond substrate, wherein the metallic layer is a non-continuous film to expose portion of the upper surface, and a metal composition of the metallic layer has at least one of the following features that lattice mismatch between the metal composition and diamond is less than 15% and dissolution rate of carbon in the metal composition is less than 2 wt %;
providing a reaction atmosphere; and
depositing an epitaxial diamond layer on the exposed upper surface of the diamond substrate and then the epitaxial diamond layer laterally growing to form a continuous film to cover the metallic layer.

2. The method for growing epitaxial diamond according to claim 1, wherein the diamond substrate is a single crystal diamond, a polycrystalline diamond, a homoepitaxial diamond film or a hetepitaxial diamond film.

3. The method for growing epitaxial diamond according to claim 1, wherein the method to deposit the metallic layer on the diamond substrate is using evaporation deposition, sputtering, molecular beam epitaxy (MBE) growth method, atmospheric pressure chemical vapor deposition, low-pressure chemical vapor deposition, plasma enhanced chemical vapor deposition, spin coating method or chemical synthesis method.

4. The method for growing epitaxial diamond according to claim 1, wherein the metal composition of the metallic layer is selected from gold, silver, copper, platinum, iridium, nickel, cobalt, and palladium.

5. The method for growing epitaxial diamond according to claim 1, wherein the thickness of the metallic layer is less than 1 micrometer.

6. The method for growing epitaxial diamond according to claim 1, wherein the method for depositing the epitaxial diamond layer is using microwave plasma chemical vapor deposition, hot filament chemical vapor deposition, plasma enhanced chemical vapor deposition, low-pressure chemical vapor deposition or DC plasma chemical vapor deposition.

7. The method for growing epitaxial diamond according to claim 1, wherein the gas species of the reaction atmosphere is selected from hydrogen, argon, carbon oxide, carbon dioxide, alkanes, alkenes, and alkynes.

8. The method for growing epitaxial diamond according to claim 1, wherein the epitaxial diamond layer is formed as island on the exposed upper surface of the diamond substrate initially and then laterally grows to form the continuous film.

9. The method for growing epitaxial diamond according to claim 1, wherein a carbide layer is arranged between the epitaxial diamond layer and the metallic layer.

10. The method for growing epitaxial diamond according to claim 1, wherein the epitaxial diamond layer is (100) or (111) epitaxy.

11. A method for growing epitaxial diamond comprising:
providing a diamond substrate;
deposing at least a metallic layer on the diamond substrate, wherein a metal composition of the metallic layer has at least one of the following features that lattice mismatch between the metal composition and diamond is less than 15% and dissolution rate of carbon in the metal composition is less than 2 wt %;

providing an annealing process to crack the metallic layer into a non-continuous film;
providing a reaction atmosphere; and
depositing an epitaxial diamond layer on the diamond substrate and the metallic layer.

12. The method for growing epitaxial diamond according to claim 11, wherein the diamond substrate is a single crystal diamond, a polycrystalline diamond, a homoepitaxial diamond film or a hetepitaxial diamond film.

13. The method for growing epitaxial diamond according to claim 11, wherein the method to deposit a metallic layer on the diamond substrate is using evaporation deposition, sputtering, molecular beam epitaxy (MBE) growth, atmospheric pressure chemical vapor deposition, low-pressure chemical vapor deposition, plasma enhanced chemical vapor deposition, spin coating method or chemical synthesis method.

14. The method for growing epitaxial diamond according to claim 11, wherein the metal composition of the metallic layer is selected from gold, silver, copper, platinum, iridium, nickel, cobalt, and palladium.

15. The method for growing epitaxial diamond according to claim 11, wherein the thickness of the metallic layer is less than 1 micrometer.

16. The method for growing epitaxial diamond according to claim 11, wherein the method to deposit a metallic layer on the diamond substrate is using evaporation deposition, sputtering, molecular beam epitaxy (MBE) growth, atmospheric pressure chemical vapor deposition, low-pressure chemical vapor deposition, plasma enhanced chemical vapor deposition, spin coating method or chemical synthesis method.

17. The method for growing epitaxial diamond according to claim 11, wherein the gas species of the reaction atmosphere is selected from hydrogen, argon, carbon oxide, carbon dioxide, alkanes, alkenes, and alkynes.

18. The method for growing epitaxial diamond according to claim 11, wherein the annealing process comprises plasma annealing, protective atmosphere annealing, or vacuum annealing.

19. The method for growing epitaxial diamond according to claim 18, wherein the atmosphere of the plasma annealing is selected from hydrogen, argon, carbon oxide, carbon dioxide, alkanes, alkenes, and alkynes.

20. The method for growing epitaxial diamond according to claim 18, wherein the gas species of the protective atmosphere is selected from inert gases, hydrogen and nitrogen.

21. The method for growing epitaxial diamond according to claim 11, wherein the process temperature of the annealing process is higher than the melting point of the metallic layer or near the eutectic temperature of the metallic layer and carbon.

22. The method for growing epitaxial diamond according to claim 11, wherein the non-continuous film is plate-like, spherical or island-like agglomerates.

23. The method for growing epitaxial diamond according to claim 11, wherein the epitaxial diamond layer is formed as island initially and then laterally grows to form a continuous film.

24. The method for growing epitaxial diamond according to claim 11, wherein a carbide layer is arranged between the epitaxial diamond layer and the metallic layer.

25. The method for growing epitaxial diamond according to claim 11, wherein the epitaxial diamond layer is (100) or (111) epitaxy.

* * * * *